(12) United States Patent
Lucas et al.

(10) Patent No.: US 9,080,713 B2
(45) Date of Patent: Jul. 14, 2015

(54) WALLMOUNT SYSTEM AND METHOD

(71) Applicant: Ergotron, Inc., St. Paul, MN (US)

(72) Inventors: James R. Lucas, Saint Paul, MN (US); Patrick Leonard Plehn, Saint Paul, MN (US); Robert W. Fluhrer, Prior Lake, MN (US); George Runger, Saint Paul, MN (US)

(73) Assignee: Ergotron, Inc., St. Paul, MN (US)

( * ) Notice: Subject to any disclaimer, the term of this patent is extended or adjusted under 35 U.S.C. 154(b) by 0 days.

(21) Appl. No.: 14/208,143

(22) Filed: Mar. 13, 2014

(65) Prior Publication Data

US 2014/0263900 A1    Sep. 18, 2014

Related U.S. Application Data

(60) Provisional application No. 61/778,704, filed on Mar. 13, 2013.

(51) Int. Cl.
| | |
|---|---|
| *A47B 96/00* | (2006.01) |
| *A47K 1/00* | (2006.01) |
| *A47K 5/00* | (2006.01) |
| *E04G 5/06* | (2006.01) |
| *F16L 3/08* | (2006.01) |
| *F21V 35/00* | (2006.01) |
| *F16M 13/02* | (2006.01) |
| *F16M 11/04* | (2006.01) |

(52) U.S. Cl.
CPC .............. *F16M 13/02* (2013.01); *F16M 11/041* (2013.01); *Y10T 29/49826* (2015.01)

(58) Field of Classification Search
CPC ....................................................... A47G 1/16
USPC ............. 248/690, 693, 447.1, 450, 489, 493, 248/494, 220.21, 220.22, 221.11, 222.11, 248/222.13, 223.41, 224.7, 224.8, 225.11, 248/225.21, 304, 307, 317, 320, 322, 323, 248/327, 328, 339, 341
See application file for complete search history.

(56) References Cited

U.S. PATENT DOCUMENTS

| | | | | |
|---|---|---|---|---|
| 153,789 | A * | 8/1874 | Simpson | 248/489 |
| 722,311 | A * | 3/1903 | Magerhans | 248/495 |
| 904,690 | A * | 11/1908 | Francis | 248/496 |
| 1,908,147 | A * | 5/1933 | Hoegger | 248/489 |
| 4,520,984 | A * | 6/1985 | Rouleau | 248/489 |
| 5,669,593 | A * | 9/1997 | Kirchner | 248/476 |
| 7,712,717 | B2 * | 5/2010 | Burns | 248/291.1 |
| 7,798,460 | B2 * | 9/2010 | Park | 248/324 |
| 7,883,069 | B2 * | 2/2011 | Park et al. | 248/328 |
| 8,297,571 | B2 * | 10/2012 | Xue | 248/220.22 |
| 8,322,673 | B2 * | 12/2012 | Sculler | 248/317 |
| 8,556,220 | B1 * | 10/2013 | Chen | 248/222.13 |
| 8,695,936 | B2 * | 4/2014 | Park et al. | 248/231.91 |
| 2005/0242254 | A1 * | 11/2005 | Dozier | 248/284.1 |
| 2007/0007409 | A1 * | 1/2007 | Huang | 248/220.21 |

* cited by examiner

*Primary Examiner* — Terrell McKinnon
*Assistant Examiner* — Michael McDuffie
(74) *Attorney, Agent, or Firm* — Schwegman Lundberg & Woessner, P.A.

(57) ABSTRACT

A mounting system includes a mounting rail, a mounting rail receiving mechanism configured to selectively receive the mounting rail and to attach to a vertical surface, and a mounting tab configured to attach to a rear of a flat panel electronic device and positionable along the mounting rail.

16 Claims, 9 Drawing Sheets

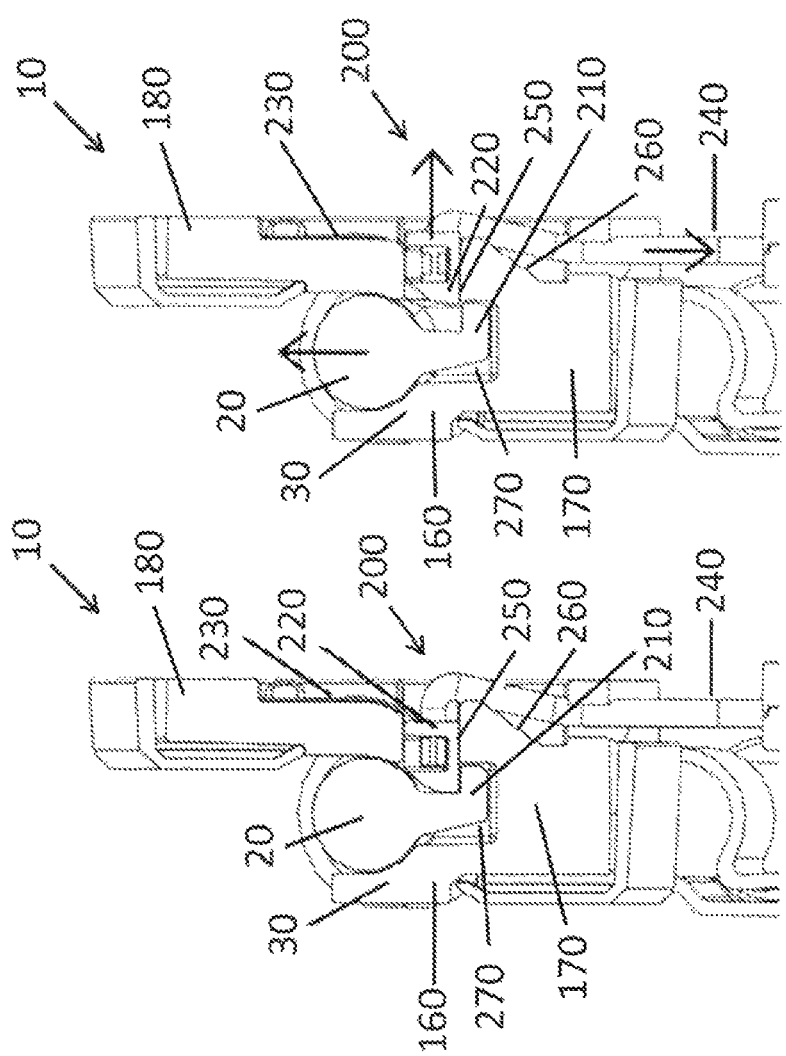

WALLMOUNT SYSTEM AND METHOD

CLAIM OF PRIORITY

This application claims the benefit of priority under 35 U.S.C. §119(e) of U.S. Provisional Patent Application Ser. No. 61/778,704, filed on Mar. 13, 2013, which is herein incorporated by reference in its entirety.

FIELD

This invention generally relates to system and methods for mounting electronic devices.

BACKGROUND

Electronic devices, such as flat panel televisions, are generally large devices having a height dimension and a width dimension much greater than a depth dimension. They are often mounted to walls for viewing.

SUMMARY

Embodiments of the invention include a mounting system. In some embodiments, the mounting system includes a mounting rail, a mounting rail receiving mechanism configured to selectively receive the mount rail and to attach to a vertical surface, and a mounting tab configured to attach to a rear of a flat panel electronic device and positionable along the mounting rail. Such a mounting system is useful for attaching a flat panel electronic device to vertical surface such as a wall. Embodiments of the invention also include methods of using mounting systems.

BRIEF DESCRIPTION OF THE DRAWINGS

The following drawings are illustrative of particular embodiments of the present invention and therefore do not limit the scope of the invention. The drawings are not to scale (unless so stated) and are intended for use in conjunction with the explanations in the following detailed description. Embodiments of the invention will hereinafter be described in conjunction with the appended drawings, wherein like numerals denote like elements.

FIG. 9A is side plan cross-sectional view of a locked mounting system in accordance with an embodiment of the invention; and FIG. 9B is side plan cross-sectional view of an unlocked mounting system in accordance with an embodiment of the invention.

DETAILED DESCRIPTION OF THE PREFERRED EMBODIMENTS

The following detailed description is exemplary in nature and is not intended to limit the scope, applicability, or configuration of the invention in any way. Rather, the following description provides some practical illustrations for implementing exemplary embodiments of the present invention. Examples of constructions, materials, dimensions, and manufacturing processes are provided for selected elements, and all other elements employ that which is known to those of ordinary skill in the field of the invention. Those skilled in the art will recognize that many of the noted examples have a variety of suitable alternatives.

Figure 1:
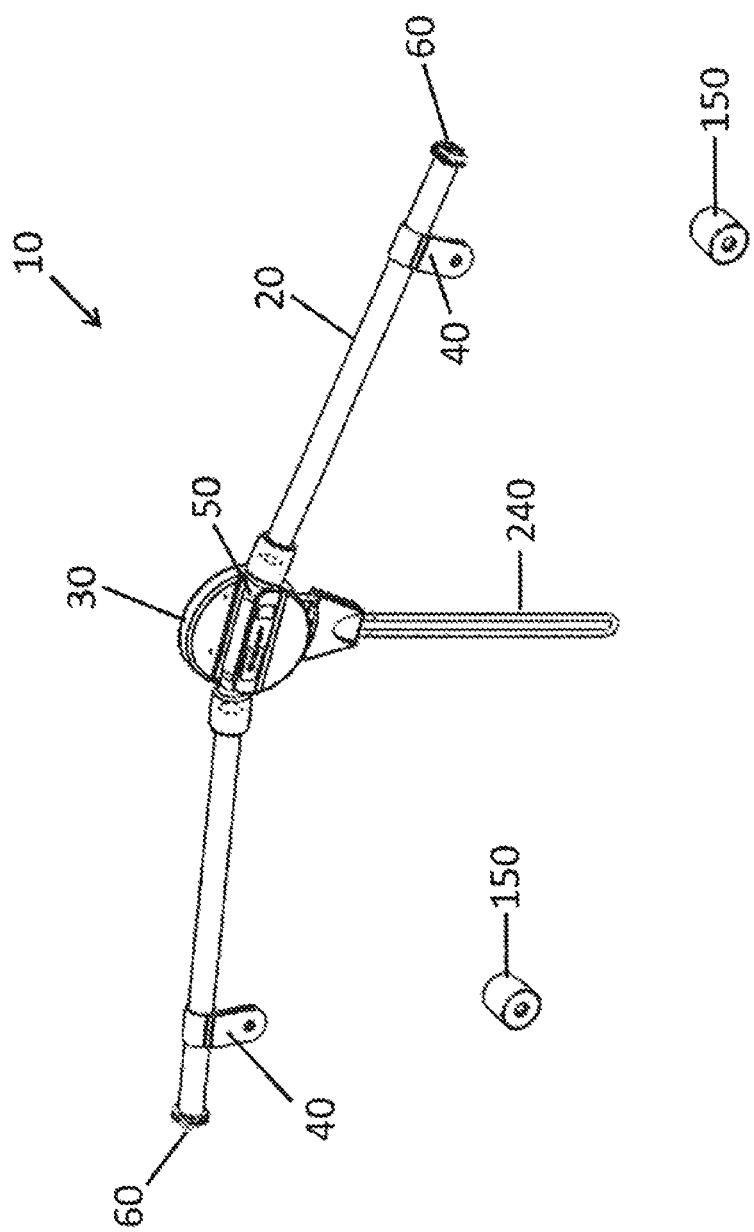
FIG. 1 is a perspective view of a mounting system in accordance with an embodiment of the invention.

FIG. 1 is a perspective view of a mounting system 10 in accordance with an embodiment of the invention. The mounting system is useful for mounting a wide variety of flat panel electronic devices, such as flat panel displays, to a vertical surface such as a wall. The flat panel electronic devices generally have a width and height much greater than a depth, and have mounting locations located on a rear surface. The mounting locations may be compliant with a VESA pattern.

Figure 2:
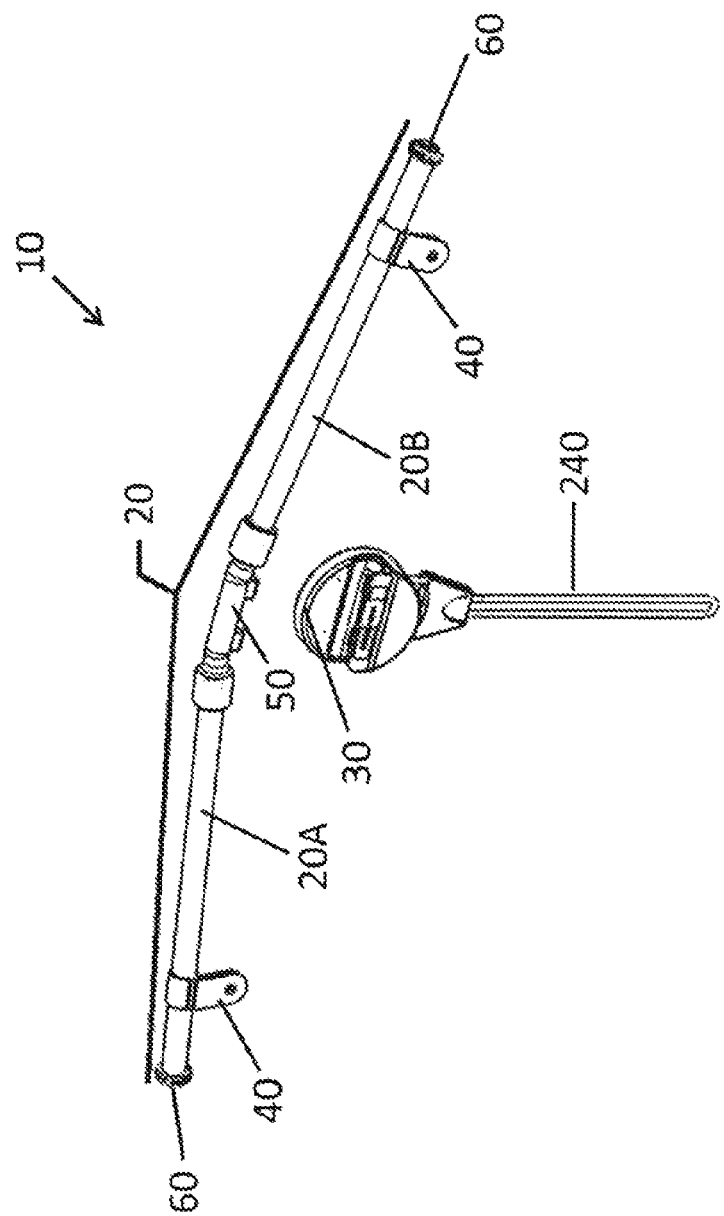
FIG. 2 is a perspective view of a disengaged mounting system in accordance with an embodiment of the invention.

In some embodiments, as shown in FIG. 1, the mounting system 10 includes a mounting rail 20, a mounting rail receiving mechanism 30 configured to attach to a vertical surface, and a mounting tab 40 configured to attach to a rear of the electronic device and positionable along the mounting rail 20. In the embodiment shown, the mounting rail 20 extends beyond both sides of the mounting rail receiving mechanism 30. FIG. 1 shows the mounting rail 20 connected to the mounting rail receiving mechanism 30, while FIG. 2 shows the mounting rail 20 disconnected from the mounting rail receiving mechanism 30.

Figure 3:
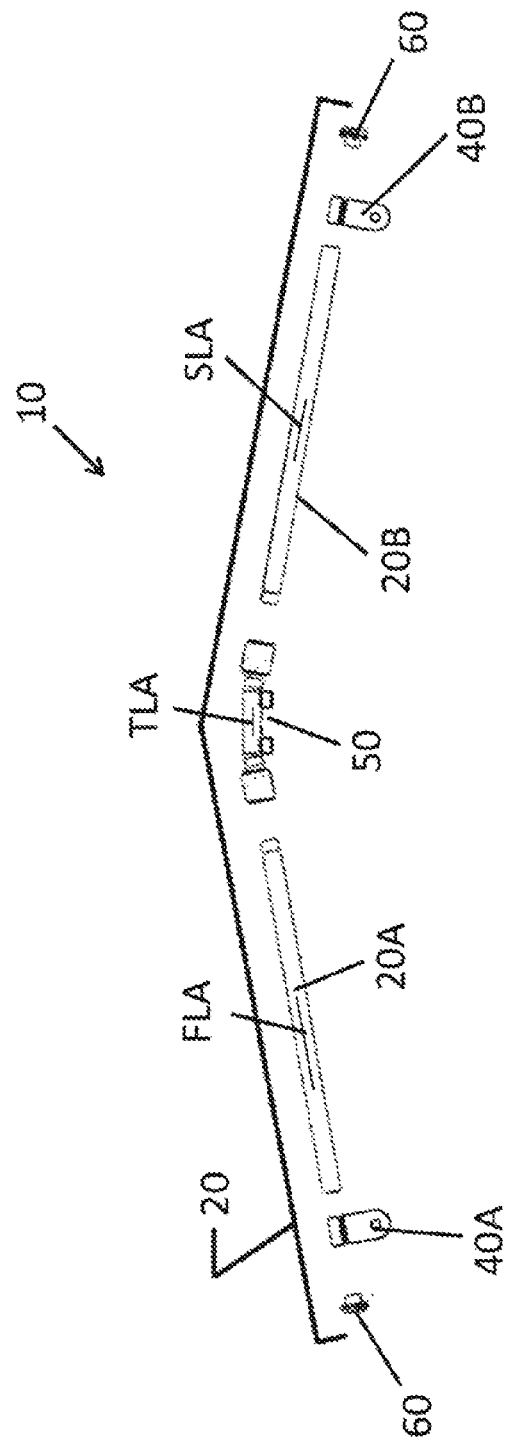
FIG. 3 is a top plan exploded view of a mounting system in accordance with an embodiment of the invention.

As shown in FIG. 3, in some embodiments the mounting rail 20 includes a first rail 20A and a second rail 20B, each extending from a center section 50. The center section can be selectively joined (e.g., threadingly engaged) with the mounting rail receiving mechanism 30. In some embodiments the joined center section 50 is rotatable about a generally horizontal axis with respect to the mounting rail receiving mechanism 30 to allow the electronic device to be tilted away from a wall after attachment to provide access to the rear of the device for cable connections and routing. In such embodiments, the center section 50 can include a generally cylindrical shape for facilitating desired rotational movement with respect to the receiving mechanism 30.

With continued reference to FIG. 3, in some embodiments mounting rail 20 is configured such that the center section 50 is a spaced horizontal distance from the electronic device after attachment to the electronic device. Such spacing provides a gap for routing cables and can facilitate the connection between the mounting rail 20 and the mounting rail receiving mechanism 30. In some embodiments, the first rail 20A has a first longitudinal axis FLA, the second rail 20B has a second longitudinal axis SLA, and the center section 50 has a third longitudinal axis TLA, and the third longitudinal axis is skewed relative to both the first and second longitudinal axes.

Figure 4:
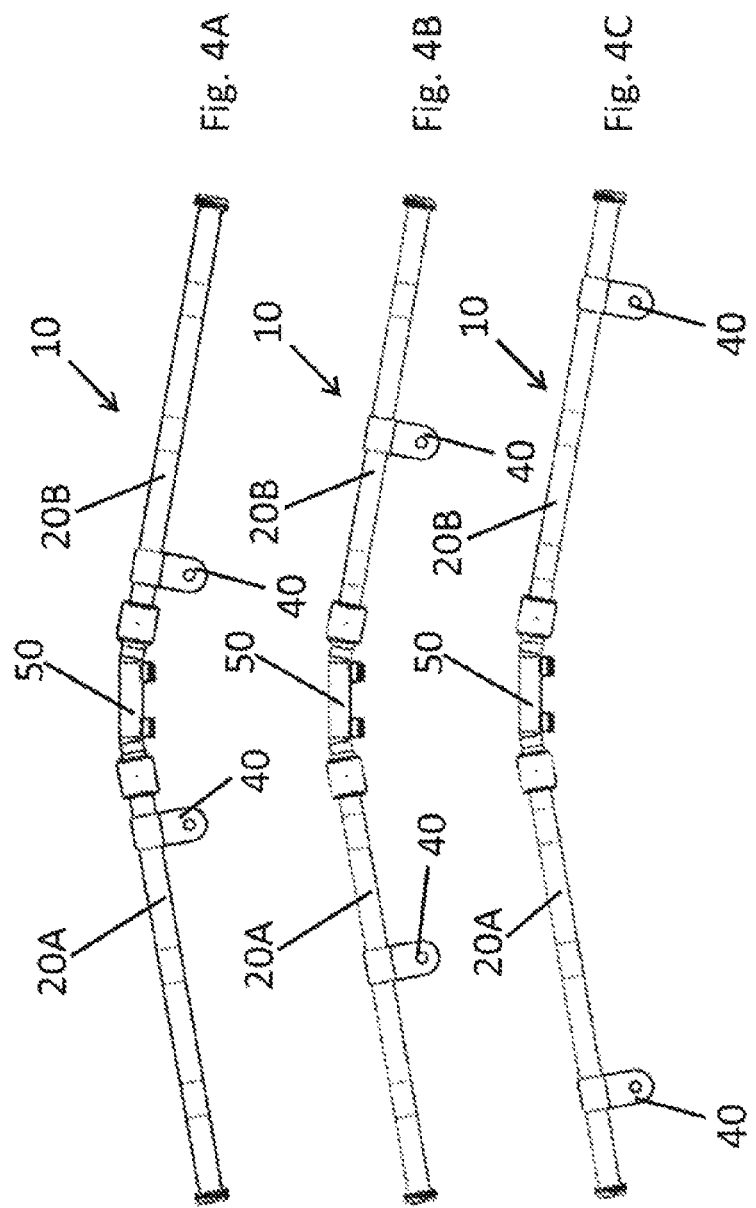
FIG. 4A is a top plan view of a mounting system with mounting tabs positioned along a mounting rail at a first position in accordance with an embodiment of the invention.
FIG. 4B is a top plan view of a mounting system with mounting tabs positioned along a mounting rail at a second position in accordance with an embodiment of the invention.
FIG. 4C is a top plan view of a mounting system with mounting tabs positioned along a mounting rail at a third position in accordance with an embodiment of the invention.

The mounting tab 40 can be positionable along the mounting rail 20. In embodiments having first and second rails 20A/B extending from a center portion 50, a first mounting tab 40A can be positionable along the first mounting rail and a second mounting tab 40B can be positionable along the second mounting rail. In some embodiments the mounting tabs can be positioned at any position along the length of the rail 20. In certain embodiments, end caps 60 may be provided to restrict the tabs from sliding off the end of the rail 20. FIGS. 4A-B show the mounting tabs 40 positioned in three different locations with respect to the mounting rail 20. Being able to selectively position the mounting tab 40 along the mounting rail 20 allows the mounting system 10 to mount a wide variety of electronic device sizes and accommodate different mounting locations and patterns.

Figure 5:
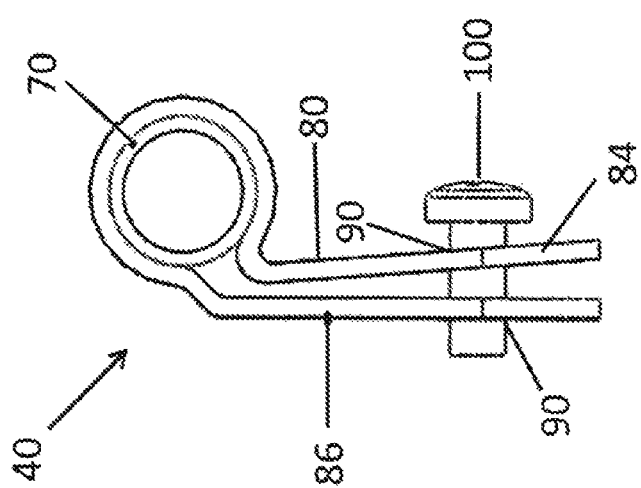
FIG. 5 is a side plan view of a mounting tab in accordance with an embodiment of the invention.

As shown best in FIG. 5, in some embodiments the mounting tab 40 includes a first portion 70 extending around the mounting rail 20 and a second portion 80 comprising two surfaces 84, 86 spaced from each other and extending from the first portion 70. The two spaced surfaces can each include an aligned fastener receiving aperture 90. In certain embodiments, the mounting tab 40 includes a P-shaped clip. In certain embodiments, when a fastener 100 is received within the mounting tab 40 to connect it to the flat panel electronic device, the two surfaces 84, 86 are forced together and the first portion 70 clamps the mounting rail 20 to prevent further movement of the mounting tab with respect to the mounting rail. Such an embodiment is useful for preventing movement of the electronic device relative to the mounting rail after attachment.

Figure 6:
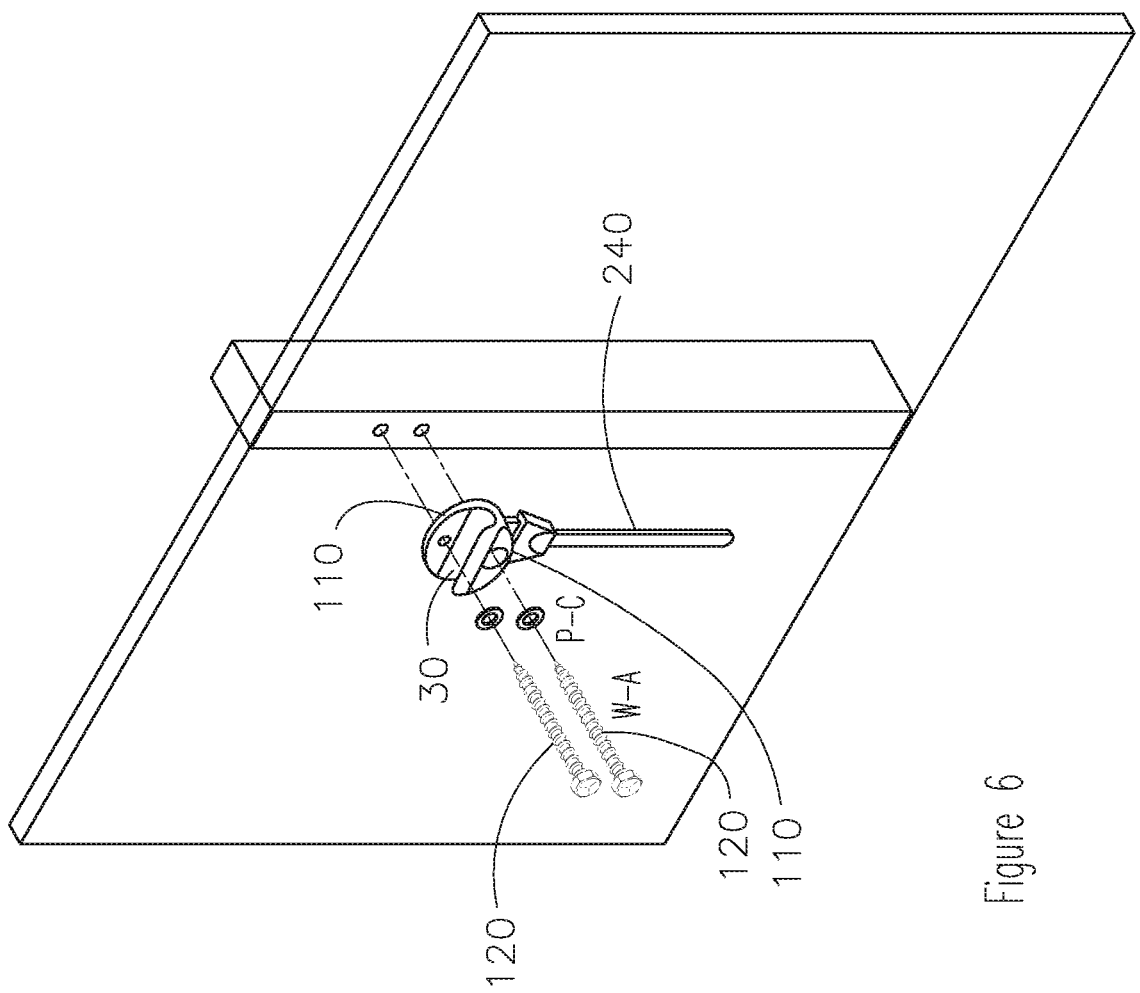
FIG. 6 is a perspective view of a mounting rail receiving mechanism in accordance with an embodiment of the invention.

FIG. 6 shows an embodiment of a mounting rail receiving mechanism 30 attached to a wall. As shown, the mechanism 30 can include fastener receiving apertures 110 for receiving fasteners 120. The fasteners can attach the mechanism 30 to a wall, such as drywall or concrete. In some embodiments the mechanism 30 has two vertically aligned fastener receiving apertures 110. Such a configuration is useful for attaching the mechanism 30 to a single stud.

Figure 7:
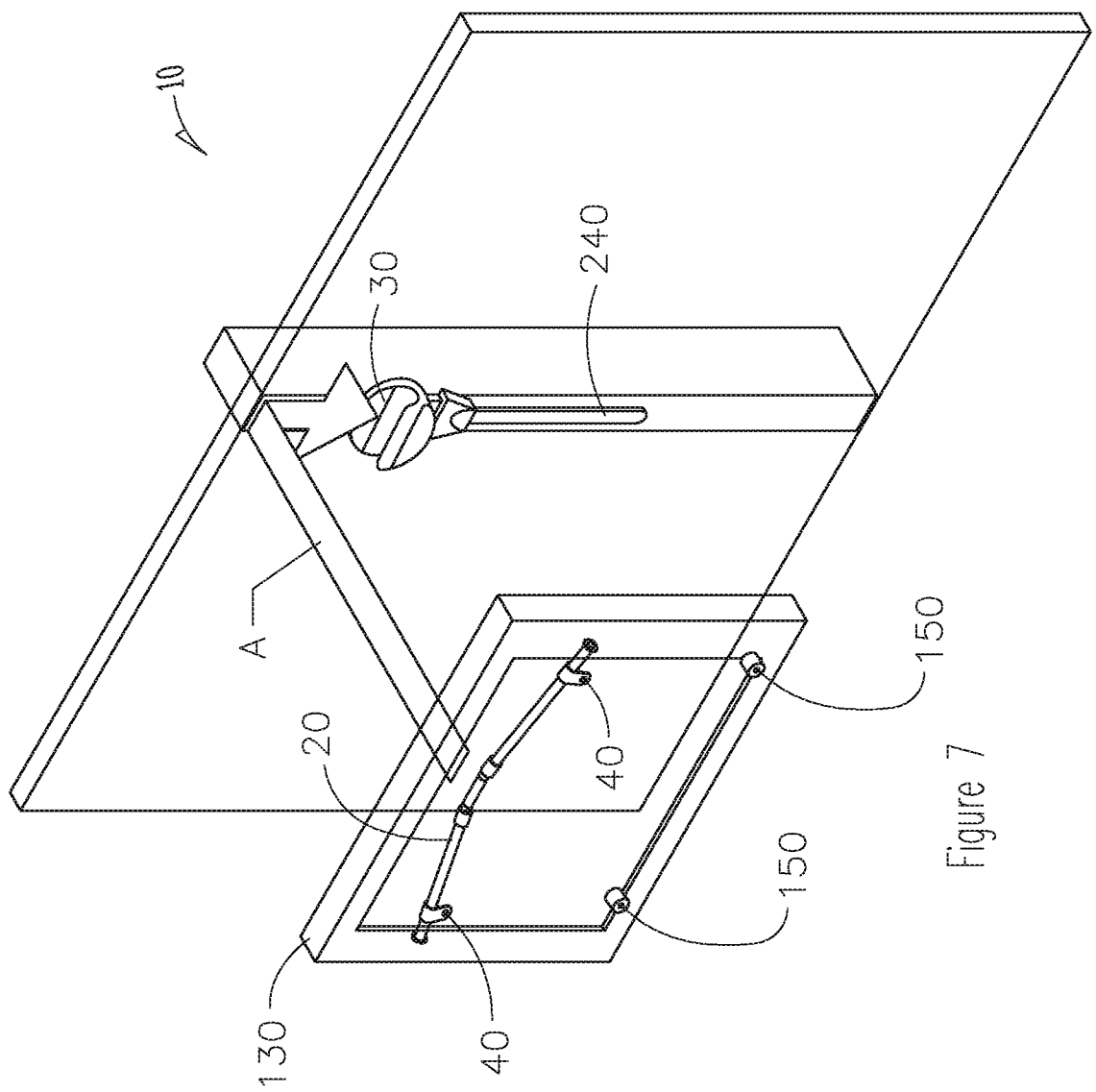
FIG. 7 is a perspective view of a disengaged mounting system in accordance with an embodiment of the invention.
Figure 8:
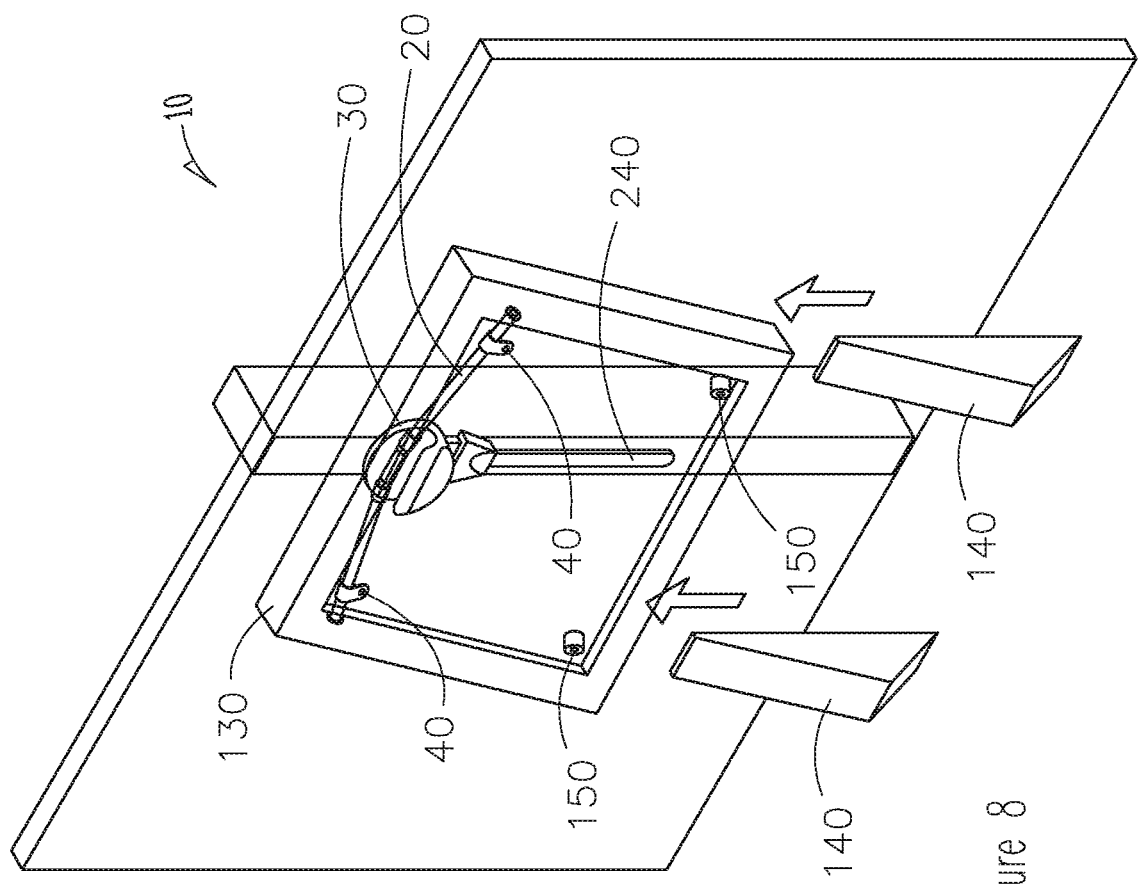
FIG. 8 is a perspective view of an engaged mounting system in accordance with an embodiment of the invention.

FIG. 7 shows a mounting rail 20 attached to the rear of a flat panel electronic device 130. The arrow A depicts an engagement path to engage the mounting rail 20 with the mounting rail receiving mechanism 30. FIG. 8 shows the flat panel electronic device 130 attached to the mounting rail 20 engaged with the mounting rail receiving mechanism 30 and attached to the wall. FIG. 8 also depicts wedges 140 that can be used to displace the bottom of the electronic device from the wall (in embodiments allowing for rotational movement between the rail and mechanism) for greater access to cables and connections during device set up. For final installation, the wedges 140 can be removed and in some embodiments spacers 150 attached to the rear of the electronic device 130 can rest directly against the wall to orientate the electronic device in a generally vertical plane for viewing.

The mounting rail receiving mechanism 30 can include any shape useful for receiving the mounting rail 20. As shown best in FIGS. 9A-B, the mechanism 30 can have a first portion 160 in a generally vertical plane, a second portion 170 in a generally horizontal plane extending rearward from the first portion, and a third portion 180 in a generally vertical plane rearward of the second portion. The third portion can be in apposition to the vertical surface when the mounting rail receiving mechanism 30 is attached to the vertical surface. Such a mechanism 30 includes a generally upward facing C-shape to receive the mounting rail 20, and allows for rotational movement about a generally horizontal axis between the mounting rail 20 and the mechanism 30.

In some embodiments, as shown in FIGS. 9A-B, the mounting system 10 includes a lock mechanism 200 to releasably lock the mounting rail 20 to the mounting rail receiving mechanism 30. In certain embodiments the lock mechanism prohibits the mounting rail 20 from being lifted from the receiving mechanism 30 yet allows for some rotational movement between the rail and the mechanism. FIG. 9A shows the lock mechanism 200 in a locked position that prohibits disengagement of the rail 20 from the rail receiving mechanism 30, while FIG. 9B shows the lock mechanism 200 in an unlocked position that does not prohibit disengagement of the rail from the rail receiving mechanism 30.

In the embodiment shown, the mounting rail 20 (e.g., center section 50) includes a locking member 210 engagable with a locking tab 220 of the mounting rail receiving mechanism 30. The locking tab 220 can be biased to engage the locking member by a spring 230. In some embodiments, the locking tab 220 is connected to a pull member 240 (e.g., a flexible element, such as a cable) extending from the mounting rail receiving mechanism 30. As shown, the locking tab 220 can be in sliding engagement with a locking tab support surface 250 and the pull member 240 can contact a cam surface 260 such that a downward force applied to the pull member 240 causes a lateral force to be applied to the locking tab 220 to cause it to move laterally against the spring 230 to disengage from the locking member 210 and release the mounting rail 20 from the mounting rail receiving mechanism 30.

As shown in FIGS. 9A-B, the mounting rail receiving mechanism 30 can be configured to provide a gap 270 around the locking member 210 so as not to restrict any desired rotational movement between the mounting rail 20 and the mounting rail receiving mechanism 30.

Embodiments of the invention also include methods of mounting a flat panel electronic device to a vertical surface with a mounting system. In some embodiments, the method includes one or more steps of, positioning a mounting tab along a mounting rail to align it with a mounting location on a rear of the flat panel electronic device, fastening the mounting tab to the rear of the flat panel electronic device, fastening a mounting rail receiving mechanism to the vertical surface, and engaging the mounting rail with the mounting rail receiving mechanism.

Thus, embodiments of the invention are disclosed. Although the present invention has been described in considerable detail with reference to certain disclosed embodiments, the disclosed embodiments are presented for purposes of illustration and not limitation and other embodiments of the invention are possible. One skilled in the art will appreciate that various changes, adaptations, and modifications may be made without departing from the spirit of the invention.

What is claimed is:

1. A mounting system, comprising:
   a mounting rail;
   a mounting rail receiving mechanism configured to selectively receive the mounting rail and to attach to a vertical surface; and
   a mounting tab configured to attach to a rear of a flat panel electronic device and selectively positionable to different positions along the length of the mounting rail;
   wherein the mounting rail includes a locking member engagable with a locking tab of the mounting rail receiving mechanism, wherein the locking tab is connected to a pull member extending from the mounting rail receiving mechanism; and
   wherein the locking tab is in sliding engagement with a locking tab support surface and the pull member contacts a cam surface such that a downward force applied to the pull member causes a lateral force to be applied to the locking tab to cause it to move laterally against a spring to disengage from the locking member and release the mounting rail from the mounting rail receiving mechanism.

2. The mounting system of claim 1, wherein the mounting tab includes a first portion extending around the mounting rail and a second portion comprising two spaced surfaces extending from the first portion, the two spaced surfaces each including an aligned fastener receiving aperture, wherein when a fastener is received within the mounting tab to connect it to the flat panel electronic device the first portion clamps the mounting rail to prevent further movement of the mounting tab with respect to the mounting rail.

3. The mounting system of claim 2, wherein the mounting tab includes a P-shaped clip.

4. The mounting system of claim 1, wherein the mounting rail includes a first rail and a separate second rail each extending from a center section.

5. The mounting system of claim 4, wherein the center section selectively joins with the mounting rail receiving mechanism.

6. The mounting system of claim 5, wherein when joined the center section is rotatable about a generally horizontal axis with respect to the mounting rail receiving mechanism.

7. The mounting system of claim 1, wherein the mounting rail receiving mechanism has a first portion in a generally vertical plane, a second portion in a generally horizontal plane extending rearward from the first portion, and a third portion in a generally vertical plane rearward of the second portion, the third portion in apposition to the vertical surface when the mounting rail receiving mechanism is attached to the vertical surface.

8. The mounting system of claim 1, wherein the first rail has a first longitudinal axis, the second rail has a second longitudinal axis, and the center section has a third longitudinal axis, the third longitudinal axis being skewed relative to both the first and second longitudinal axes.

9. The mounting system of claim 1, wherein the locking tab is biased to engage the locking member by a spring.

10. The mounting system of claim 1, wherein the pull member is a cable extending downward from the mounting rail receiving mechanism.

11. The mounting system of claim 1, wherein the mounting rail is rotatable about a generally horizontal axis with respect to the mounting rail receiving mechanism, and further including a spacer configured to attach to the flat panel electronic display and space the flat panel electronic device from a wall.

12. The mounting system of claim 1, wherein the mounting rail is rotatable about a generally horizontal axis with respect to the mounting rail receiving mechanism, further including a wedge configured to space the flat panel electronic device from the vertical surface.

13. The mounting system of claim 1, further including an end cap engagable with an end of the mounting rail to retain the mounting tab on the mounting rail.

14. A method of mounting a flat panel electronic device to a vertical surface, comprising the steps of:
   selectively positioning a mounting tab to a chosen position along the length a mounting rail to align the mounting tab with a mounting location on a rear of the flat panel electronic device;
   fastening the mounting tab to the rear of the flat panel electronic device;
   fastening a mounting rail receiving mechanism to the vertical surface; and
   engaging the mounting rail with the mounting rail receiving mechanism;
   wherein the mounting rail includes a locking member engagable with a locking tab of the mounting rail receiving mechanism, wherein the locking tab is connected to a pull member extending from the mounting rail receiving mechanism;
   wherein the locking tab is in sliding engagement with a locking tab support surface and the pull member contacts a cam surface such that a downward force applied to the pull member causes a lateral force to be applied to the locking tab to cause it to move laterally against a spring to disengage from the locking member and release the mounting rail from the mounting rail receiving mechanism.

15. The method of claim 14, wherein fastening the mounting tab to the rear of the flat panel electronic device clamps the mounting tab to the mounting rail.

16. The method of claim 14, further comprising the step rotating the mounting rail about a generally horizontal axis with respect to the mounting rail receiving mechanism after engaging the mounting rail with the mounting rail receiving mechanism.

\* \* \* \* \*